(12) United States Patent
Taylor et al.

(10) Patent No.: US 6,827,833 B2
(45) Date of Patent: Dec. 7, 2004

(54) ELECTRODEPOSITION OF METALS IN HIGH-ASPECT RATIO CAVITIES USING MODULATED REVERSE ELECTRIC FIELDS

(75) Inventors: E. Jennings Taylor, Troy, OH (US); Jenny J. Sun, Tipp City, OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 65 days.

(21) Appl. No.: 09/975,974

(22) Filed: Oct. 15, 2001

(65) Prior Publication Data

US 2003/0075450 A1 Apr. 24, 2003

(51) Int. Cl.$^7$ ............................................. C25D 5/18
(52) U.S. Cl. ..................... 205/103; 205/102; 205/105; 205/118; 205/123; 205/125; 205/131
(58) Field of Search ................. 205/103, 105, 205/118, 123, 125, 131, 102

(56) References Cited

U.S. PATENT DOCUMENTS

| | | | | |
|---|---|---|---|---|
| 4,396,467 A | * | 8/1983 | Anthony | 205/103 |
| 6,071,398 A | * | 6/2000 | Martin et al. | 205/103 |
| 6,197,181 B1 | * | 3/2001 | Chen | 205/123 |
| 6,309,528 B1 | * | 10/2001 | Taylor et al. | 205/103 |
| 6,491,806 B1 | * | 12/2002 | Dubin et al. | 205/296 |

FOREIGN PATENT DOCUMENTS

EP        1054080 A2  * 11/2000  ............ C25D/3/38

\* cited by examiner

*Primary Examiner*—Edna Wong
*Assistant Examiner*—Brian L. Mutschler
(74) *Attorney, Agent, or Firm*—Thompson Hine LLP

(57) ABSTRACT

The interior of cavities and through-holes in electrically conductive substrates having high-aspect ratios of 8:1 or greater can be electroplated with a uniform layer of metal on their interior surfaces by using a pulse reverse voltage waveform having a pulse train of long cathodic pulses followed by short anodic pulses even in the absence of conventional additives such as levelers and brighteners.

28 Claims, 1 Drawing Sheet

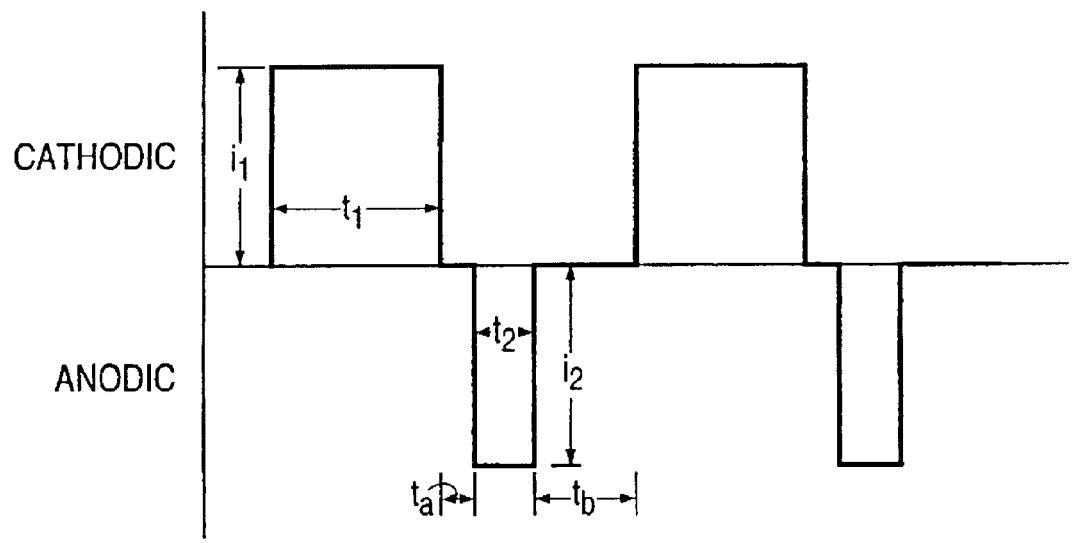

ELECTRODEPOSITION OF METALS IN HIGH-ASPECT RATIO CAVITIES USING MODULATED REVERSE ELECTRIC FIELDS

BACKGROUND OF THE INVENTION

1. Field of the Invention

This invention relates to electrodeposition of metals in deep cavities and more particularly to depositing a uniform layer of metal on the interior surfaces of a recess or hole having a high aspect ratio.

2. Brief Description of the Prior Art

Electronic devices such as computers, cellular telephones, electronic entertainment devices, and the like, have long been manufactured by mounting components on circuit boards having electrically conductive traces thereon to interconnect the components.

In the manufacture of such electronic equipment, development of technology and economics have driven the industry toward ever-smaller devices, containing ever-increasing numbers of components. At the level of semiconductor devices very large scale integration (VLSI) and ultra large scale integration (ULSI), hereafter referred to as simply VLSI, has produced chips containing up to a few million transistors on a single semiconductor chip no larger than several millimeters on a side. Such chips have conventionally been packaged or encapsulated in small modules having external lead wires for interconnecting the chips. The interconnections have conventionally been provided by circuit boards having electrical conductors prepared by so called "printed wiring" techniques that involve masking, etching, and plating of conductive metal, usually copper, to provide the interconnects between chip modules or sockets designed to hold such modules. These "printed wiring boards" (PWB) have typically been used to interconnect chips of conventional sizes. The chips or socket are mounted on the surface of the board with terminals fitted into holes through the board. The holes are typically lined with a thin layer of copper that is integral with the traces of copper on the surface of the board. The terminals of the chips or sockets are soldered to the copper layer lining the holes and thereby interconnected through the copper traces. The PWBs may have copper traces on both sides as well as more than one inner layer of copper traces. Connections between copper traces in the different layers of these double-sided and multilayered PWBs are also provided by copper-lined holes passing through the board, commonly known as plated through-holes (PTHs).

The copper lining in such holes is typically applied electrolytically, by first laying down a thin layer of electroless copper to provide electrical continuity and then electroplating copper to a thickness of a few mils to provide the connecting layer. While the copper could be applied solely using the electroless process, the processing time for the electroless process is significantly greater than the processing time for the electrolytic process. The holes in the PWBs typically are at least 12–13 mils in diameter. Because of the well-known problem of depositing metal electrolytically in recesses, special techniques have to be used to assure that a uniform layer of conductive metal is deposited in the holes. Consequently conventional techniques to enhance the "throwing power" of the electroplating system have been employed, such as agitation of the bath, addition of certain chemical compounds to the electroplating bath, and/or the use of pulsed current plating. Furthermore, while a full-build electroless process can somewhat alleviate the throwing power issue associated with the electrolytic process, the added processing time reduces throughput.

Although conventional techniques have generally been successful in the manufacture of PWBs having the dimensions that have been commonly used in electronic devices such as television receivers, personal computers, and the like, the trend to ever smaller equipment such as cellular telephones, palm computers, portable global positioning devices, more advanced computers, and the like, has led to the necessity of mounting chips closer together in multichip modules (MCMs). Furthermore, the increase in the number of chips mounted on a board has resulted in a corresponding increase in the interconnections. This in turn has required the use of thicker circuit boards having more layers. Consequently, the through-holes and vias that interconnect the layers may become longer and/or deeper without increasing in diameter. The ratio of length to diameter (or to one transverse dimension if the hole or cavity is not of circular cross-section) is commonly referred to as the aspect ratio.

Electroplating of the interior of holes and or recesses in a circuit board has frequently relied on chemical additives to the plating bath that promote uniform deposition of metal. The ability of a bath or component thereof to promote uniform deposition of metal in holes, recesses, and the like has come to be known as "throwing power".

Additionally, it has been discovered that the use of pulsed current electrolytic waveforms can enhance the plating of metal in the interior of through-holes and the like. In particular, the use of a waveform having a long cathodic pulse followed by a short anodic pulse has been found to be useful in plating the interior surfaces of holes of conventional circuit boards having holes larger than about 325 micrometers (13 mils), having an aspect ratio, i.e., the ratio of the length the hole to the diameter thereof, of about 4:1. It has also been found that when such a waveform is used uniform plating may be achieved even when conventional additives such as levelers and brighteners are omitted from the bath.

In some circuit boards intended for use with small devices such as cellular telephones, hand-held computers and the like, wherein the chips are placed very close together, the holes are typically of smaller diameter than those of conventional PWBs, and may range from about 25 micrometers (1 mil) to about 250 micrometers (10 mils). Such holes are also effectively blind holes and the conductor deposition step provides the electrical contact to the terminal pads on the semiconductor devices as well as the interconnections between the devices. The use of small chips mounted close together and interconnected by means of conductors deposited in small holes has come to be known as high density interconnect (HDI) technology. Plating of such small through-holes and vias has presented problems in achieving uniform deposition of metal both on the surface of the board and within the holes and vias. An effective method of plating such holes using defined pulse waveforms has been disclosed in U.S. Pat. No. 6,210,555, to Taylor et al., as well as in copending U.S. patent application Ser. No. 09/172,299, filed Oct. 14, 1998, copending application Ser. No. 09/553,616, filed Apr. 20, 2000, copending application Ser. No. 09/419,881, filed Oct. 18, 1999, copending application Ser. No. 09/823,749, filed Apr. 03, 2001, and copending application Ser. No. 09/824,663, filed Apr. 04, 2001, the entire disclosures of which are incorporated herein by reference.

As discussed therein, surfaces located within small recesses, cavities and holes can be hydrodynamically inaccessible to the supply of ionically dissolved metals within the plating bath and require defined waveforms to achieve uniform deposition.

However, it has now been found that through-holes and cavities of the dimensions found in conventional circuit boards, i.e., having diameters of about 325 micrometers or greater, but also having aspect ratios greater than about 4:1, are difficult to plate uniformly using the waveforms conventionally applied to holes of such diameter. The problem is especially severe for through-holes that are being used or have been proposed for certain circuit boards wherein the through-holes have aspect ratios of 10:1, 15:1, or even 20:1 or greater. When circuit boards having such through-holes are plated, the metal, e.g., copper, tends to be deposited preferentially near the mouth of the holes. The central region of the holes, i.e., the region approximately equidistant from either surface of the board tends to receive a thinner deposit of metal, i.e., be lightly plated, or, in extreme cases, to receive no metal at all. A through-hole having such a metal deposit on its internal surface, i.e., the wall of the hole, provides a poor electrical connection between the conductive surfaces and/or internal conductive layers of the circuit board. Furthermore, even if the central region of the hole receives some metal deposit, it may not be strong enough to resist the mechanical stresses imposed by further processing of the board. In particular, if the plating in the center of the hole is too thin or has poor mechanical properties, it may crack circumferentially when the board is subjected to elevated temperatures when solder is applied to the surfaces of the board. Such "heat shock" or "solder shock" may cause the board to expand enough to break the layer of metal at its thinness and weakest point. Such a "barrel crack" may cause the electrical connection to be broken, with the result that the board fails to pass manufacturing inspection. Even if electrical contact through the plated hole having such a crack is maintained when inspected at room temperature, the contact may be broken when the temperature of the board becomes elevated in service.

Hitherto providing a sufficiently thick coating of metal in the central region of the hole while not overplating the mouth region of the hole has been accomplished by using chemical additives, e.g., levelers, and the like, to the plating bath, and by conducting the plating at relatively low current density. However, such methods present the disadvantages of monitoring and controlling the additives and of increasing the time required to plate a circuit board.

Accordingly, a need has continued to exist for a method of depositing metallic conductors, especially copper, within holes, cavities, and the like, of circuit boards, wherein the holes or cavities have a high aspect ratio.

SUMMARY OF THE INVENTION

The problem of providing uniform deposition of metal within high aspect ratio holes and the like has now been alleviated by the process of the invention wherein it has surprisingly been discovered that a high-aspect ratio hole, or the like, can be plated using a generally conventional pulse reverse waveform having a pulse train of long cathodic pulses followed by short anodic pulses even in the absence of conventional additives such as levelers and brighteners.

Accordingly, it is an object of the invention to provide an electrochemical method for uniformly metallizing interior surfaces of through-holes, cavities and the like having high aspect ratios.

A further object is to provide a method for electrodeposition of a metal within a generally tubular substrate.

A further object is to provide a method for metallizing circuit boards having through holes, vias, cavities and the like having high aspect ratios.

Further objects of the invention will become apparent from the description of the invention which follows.

BRIEF DESCRIPTION OF THE DRAWING

The sole FIGURE illustrates the waveform of a modulated reverse electric current used in metallizing the printed wiring board and high-aspect ration through holes therein according to the method of the invention.

DETAILED DESCRIPTION OF THE INVENTION AND PREFERRED EMBODIMENTS

According to the invention, it has now been surprisingly discovered that a printed circuit board having through-holes and the like having aspect ratios of 8:1 or greater can be plated generally uniformly, by using a modulated reverse waveform, without the need for additives such as levelers, brighteners and the like.

A schematic representation of a rectangular modulated reverse electric field waveform used in the process of the invention is illustrated in the FIGURE. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in the FIGURE could represent either current or voltage. Although it is generally more convenient in practice to control the current, alternatively the voltage may be controlled. The technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In the FIGURE, the cathodic peak current is shown as $i_1$ and the cathodic on-time is $t_1$. Similarly, the anodic peak current is shown as $i_2$ and the anodic on-time is $t_2$. The relaxation time, or off-times are indicated by $t_a$ and $t_b$. The sum of the cathodic on-time, anodic on-time, and off-times (if present) is the period T of the pulse train ($T=t_1+t_2+t_a+t_b$), and the inverse of the period of the pulse train (1/T) is the frequency (f) of the pulse train. The ratio of the cathodic on-time to the period ($t_1/T$) is the cathodic duty cycle ($D_1$) and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($i_1T_1$), while the anodic charge transfer density ($Q_2$) is the product of the anodic current density and the anodic on-time ($i_2T_2$). The average current density ($I_{ave}$) is the average cathodic current density ($D_1I_1$) minus the average anodic current density ($I_2D_2$) Accordingly the relationships among the parameters may be represented by the following equations.

$$T = \frac{1}{f} = t_1 + t_2 + t_a + t_b \quad (1)$$

$$D_1 = \frac{t_1}{T} \quad (2)$$

$$D_2 = \frac{t_2}{T} \quad (3)$$

$$\frac{Q_1}{Q_2} = \frac{i_1 t_1}{i_2 t_2} \quad (4)$$

$$I_{ave} = i_1 D_1 - i_2 D_2 \quad (5)$$

$$D_1 + D_2 \leq 1 \quad (6)$$

In the process of the invention, the cathodic pulse is relatively long and the anodic pulse is relatively short. The relatively long cathodic pulses will deposit metal uniformly over the large features. Such pulses tend to deposit an excess of metal at the corners and peak portions of the substrate. They also tend to deposit excess metal at the corners of the through holes, yielding a so-called "dog-bone" profile.

The relatively short anodic pulses which follow at least some of the a cathodic pulses tend to remove metal from the corners and peaks of the substrate, thereby compensating for the overplating produced by the cathodic pulses. The result is a smooth uniform coating of metal over the relatively large features of-the substrate. Typically, the waveform used in the plating process of the invention will deposit a relatively uniform coating of metal in high aspect ratio holes having a diameter of about 350 micrometers or greater, or under some circumstances having a diameter greater than about 250 micrometers. Such dimensions are typical of the through-holes of conventional circuit boards and of the holes placed in the peripheral connecting portions of high density interconnect circuit boards.

Although the invention will be described with reference to through-holes that are assumed to have a generally circular cross-section and therefor can be characterized as having a diameter, the invention is not limited to uniform plating holes of circular cross section. The invention is useful in plating an aperture having any cross section, e.g., an oval or elliptical cross section, a square cross section, or a rectangular or trapezoidal cross section, or even a generally irregular cross section. The invention is generally applicable to plating such apertures wherein the aspect ratio as defined by the ratio of the length of the aperture to one of its transverse dimensions is about 8:1 or greater.

Accordingly, the cathodic duty cycle in the process of the invention is relatively long, typically more than about 50%, and the duty cycle of the anodic pulses should be relatively short, less than that of the cathodic pulses and preferably less than about 50%. Preferably, the cathodic duty cycle is from about 60% to about 99%, more preferably from about 70% to about 95% and still more preferably from about 80% to about 95%.

Conversely, the anodic duty cycle should be relatively short, less than about 50%, and the anodic pulses should be relatively short in order to favor removal of excess metal from the convex and peak portions of the substrate surface. Preferably, the anodic duty cycle is from about 30% to about 1%, more preferably from about 30% to about 5% and still more preferably from about 15% to about 5%. It should be noted, as pointed out above, that a period of no current flow, i.e., an "off-time", may be interpolated between a cathodic pulse and the succeeding anodic pulse or between an anodic pulse and the succeeding cathodic pulse.

The frequency of the pulse train may range from about 50 Hz to about 5000 Hz, preferably from about 70 Hz to about 2500 Hz, more preferably from about 80 Hz to about 1500 Hz, and still more preferably from about 80 Hz to about 1200 Hz.

Accordingly, the cathodic pulse is longer than the anodic pulse and may range from about 100 $\mu$s to about 19.8 milliseconds, preferably from about 200 $\mu$s to about 14.2 milliseconds, more preferably from about 334 $\mu$s to about 12.4 milliseconds, and still more preferably from about 417 $\mu$s to about 12.4 milliseconds. The anodic pulse is shorter than the cathodic pulse and may range from about 2.0 microseconds to about 10 milliseconds, preferably from about 4.0 $\mu$s to about 7.2 milliseconds, more preferably from about 6.7 $\mu$s to about 6.2 milliseconds, and still more preferably from about 8.3 $\mu$s to about 6.2 milliseconds. Although the duty cycle of the cathodic pulse will typically be greater than 50%, it is not excluded that in some circumstances the cathodic pulse may have a duty cycle less than 50%, provided that it satisfies the above-described condition that its duration be longer than the anodic pulse. A pulse train featuring a combination of pulses according to the invention, having different cathodic and anodic on-times adapted to the various features of the substrate may also be used in practicing the invention.

Because the anodic duty cycle is shorter than the cathodic duty cycle, the peak anodic voltage (and corresponding current) may be greater than the peak cathodic voltage (and corresponding current). In any case, the cathodic-to-anodic net charge ratio is adjusted to be greater than one, in order to provide a net deposition of metal on the surface. Although the anodic removal of excess metal reduces the overall efficiency of the electroplating process, the benefits of obtaining a uniform coating over the surface and the through-holes provides a benefit to the manufacturing process.

The method of the invention may be used with any metal that can be deposited by electroplating techniques. Thus copper, silver, gold, zinc, chromium, nickel, tin, lead and alloys thereof such as bronze, brass, solder, and the like, may be deposited by the process of the invention.

The plating procedure itself generally follows conventional procedure in plating circuit boards. The board is immersed in a plating bath, typically an aqueous solution containing ions bearing the metal to be plated. According to the invention, the plating bath omits at least some of the levelers and brighteners that are conventionally added. However, the plating bath may be otherwise conventional. For example, typical plating baths for depositing copper contain a copper salt, e.g., copper sulfate, sulfuric acid, a carrier material that is typically a polyethylene glycol, chloride ion, and one or more proprietary additives generally known as brighteners, levelers, and the like, to improve the uniformity, surface finish, and strength of the deposited coating. According to the invention, a bath for plating high-aspect ratio holes and features on a printed circuit board contains the conventional ingredients, such as a copper salt, e.g., copper sulfate, a carrier material that is typically a polyethylene glycol, and chloride ion, but omits at least one of the levelers and brighteners. Preferably the bat is devoid of levelers and brighteners. A preferred bath for electroplating copper according to the process of the invention is an aqueous acidic copper sulfate bath incorporating about 40 to about 80 g/L of copper sulfate, a molar ratio of sulfuric acid to copper sulfate of about 5:1 to about 8:1, about 5% of polyethylene glycol and about 30 ppm to about 60 ppm of chloride ion.

The copper is deposited by applying an electric field between the substrate as one electrode, e.g., a circuit board, and a counter electrode. The waveform of the applied voltage or current is controlled as indicated in the above discussion. The plating is continued at an average current density and for a period of time to produce a deposit of copper that has been found suitable for the electrically conductive traces and plated-through holes of a circuit board. Typically, a plating thickness ranging from about 0.7 mil (17.8 micrometers) to about 1 mil (24.4 micrometers) measured at the central portion of the through-hole, has been found suitable for providing adequate electrical conductivity as well as sufficient mechanical strength to withstand the mechanical stresses of further processing, e.g., soldering, without experiencing barrel cracking or other failures of the metal deposit. The mechanical strength of the plated coating is dependent on the metallurgical properties, e.g., grain size, of the metal deposit as well as the thickness. The metal deposit produced by the method of the invention has been found at least to match the conventional plated coating in mechanical properties and corresponding resistance to barrel cracking under heat shock conditions.

Although the ideal plated metal lining a through-hole in a printed circuit board would be of uniform thickness throughout the length of the hole, typically some variation in plating thickness is observed in conventional industrial plating of circuit boards. A certain amount of non-uniformity is tolerable in commercial practice. For example, a thicker deposit of metal near the mouth of the hole, as compared to the thickness in the central region, is acceptable if it does not interfere with assembly of components on the board. It is believed that in most applications where the plating thickness in the central region of the hole meets the 0.7–1.0 mil requirement, a plating thickness of about 2 mils at the mouth of the hole having a diameter of about 13 mils would not be unacceptable.

The invention will be illustrated by the following example which is intended to be illustrative only, the scope of the invention being limited only by the appended claims.

EXAMPLE

This example illustrates plating high aspect ratio holes in an experimental circuit board and depositing a relatively uniform layer of copper in the high aspect ratio holes.

An experimental circuit board was prepared having a thickness of about 0.25 inch (6.35 millimeters) provided with through-holes of three different diameters. The diameters of the holes were about 0.062 inch, 0.026 inch and 0.0125 inch, providing holes having aspect ratios of about 3:1, 10:1 and 20:1 respectively.

The circuit board was immersed in a copper plating bath containing conventional amounts of copper sulfate, polyethylene glycol carrier, and chloride ions, but no levelers or brighteners, and plated using a waveform of the invention. The waveform (W3) comprised cathodic pulses of 38 amperes per square foot current density for 10 milliseconds, followed by anodic pulses of 38 amperes per square foot for 2 milliseconds. The plating was continued for 120 minutes while the board was subjected to vibration and the bath was agitated. The results are shown in Table 1 below as Run A.

The experiment was repeated with another board using waveform (W4) comprising a cathodic pulse of 28 amperes per square foot current density for 13.7 milliseconds, followed by a period of no current for 0.3 milliseconds, and then an anodic pulse of 28 amperes per square foot for 2 milliseconds. The plating was continued for 120 minutes while the board was subjected to vibration and the bath was agitated. The results are shown in Table 1 below as Run B.

The boards were sectioned and the thickness of the plating at various places was measured with an appropriate microscope. The thickness of the plating was measured on the surface of the board adjacent to the hole (S), at the top of the hole HT, i.e., just inside the mouth of the hole, and at the center of the hole (HC), i.e., approximately midway between the major surfaces of the circuit board.

TABLE 1

| | Thickness of Copper Plating (mils) | | | | | | | | |
| --- | --- | --- | --- | --- | --- | --- | --- | --- | --- |
| | Aspect Ratio 20:1 | | | Aspect Ratio 10:1 | | | Aspect Ratio 3:1 | | |
| Run | S | HT | HC | S | HT | HC | S | HT | HC |
| A | 0.8 | 1.1 | 0.7 | 1.0 | 1.3 | 0.85 | 2.8 | 2.7 | 1.5 |
| B | 0.8 | 1.1 | 0.8 | 0.9 | 1.2 | 0.93 | 2.6 | 2.4 | 1.5 |

It may be seen from inspection of the results that the plating was generally relatively uniform in the high-aspect ratio holes, i.e., in most cases the thickness at the center of the hole was at least about 50% of that near the mouth of the hole, and the thickness at the center where maximum stress is imposed by heat shock test was in the range of 0.7–1.3 mils. These results indicate that the method of the invention can provide a useful procedure for plating high-aspect ratio through holes in a substrate without the need for levelers and brighteners in the plating bath.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a uniform layer of a metal on the interior surface of a cavity having an aspect ratio greater than about 8:1 comprising providing an electrically conductive substrate having a cavity therein, said cavity having a ratio of depth to at least one transverse dimension greater than 8:1;

immersing said substrate as an electrode in an electroplating bath containing ions of a metal to be deposited onto said surface, wherein said electroplating bath is devoid of levelers and brighteners;

immersing a counter electrode in said electroplating bath;

passing an electric current between said electrodes;

wherein, said electric current is a modulated reversing electric current comprising train of pulses that are cathodic with respect to said substrate and pulses that are anodic with respect to said substrate, said cathodic pulses have a charge transfer ratio with respect to said anodic pulses greater than one, said cathodic pulses have a duration in the range from about 100 $\mu$s to about 19.8 milliseconds, and said anodic pulses are shorter than said cathodic pulses and have a pulse duration in the range from about 2 $\mu$s to about 10 milliseconds.

2. The method of claim 1, wherein said cathodic pulses have a duration in the range of from about 200 µs to about 14.2 milliseconds.

3. The method of claim 1, wherein said cathodic pulses have a duration in the range of from about 334 µs to about 12.4 milliseconds.

4. The method of claim 1, wherein said cathodic pulses have a duration in the range of from about 417 µs to about 12.4 milliseconds.

5. The method of claim 1, wherein said anodic pulses have a duration in the of from about 4 µs to about 7.2 milliseconds.

6. The method of claim 1, wherein said cathodic pulses have a duration in the range of from about 6.7 µs to about 6.2 milliseconds.

7. The method of claim 1, wherein said cathodic pulses have a duration in the range of from about 8.3 µs to 6.2 milliseconds.

8. The method of claim 1, wherein said pulse train has a frequency in a range from about 50 Hz to about 5000 Hz.

9. The method of claim 1, wherein said pulse train has a frequency in a range from about 70 Hz to about 2500 Hz.

10. The method of claim 1, wherein said pulse train has a frequency in a range from about 80 Hz to about 1500 Hz.

11. The method of claim 1, wherein said pulse train has a frequency in a range from about 80 Hz to about 1200 Hz.

12. The method of claim 1, wherein said cathodic pulses have a duty cycle greater than about 50%.

13. The method of claim 1, wherein said cathodic pulses have a duty cycle from about 60 to about 99%.

14. The method of claim 1, wherein said cathodic pulses have a duty cycle from about 70% to about 95%.

15. The method of claim 1, wherein said cathodic pulses have a duty cycle from about 80% to about 95%.

16. The method of claim 1, wherein said anodic pulses have a duty cycle less than about 50%.

17. The method of claim 1, wherein said anodic pulses have a duty cycle from about 30% to about 1%.

18. The method of claim 1, wherein said anodic pulses have a duty cycle from about 30% to about 5%.

19. The method of claim 1, wherein said anodic pulses have a duty cycle from about 15% to about 5%.

20. The method of claim 1, wherein said cavity has an aspect ratio greater than about 10:1.

21. The method of claim 1, wherein said cavity has an aspect ratio greater than about 15:1.

22. The method of claim 1, wherein said cavity has an aspect ratio greater than about 20:1.

23. The method of claim 1, wherein said cavity is a through hole having an aspect ratio greater than about 8:1.

24. The method of claim 1, wherein said cavity is a through hole having an aspect ratio greater than about 10:1.

25. The method of claim 1, wherein said cavity is a through hole having an aspect ratio greater than about 15:1.

26. The method of claim 1, wherein said cavity is a through hole having an aspect ratio greater than about 20:1.

27. The method of claim 1, wherein, said electroplating bath is an aqueous acidic copper sulfate bath incorporating about 40 to about 80 g/L of copper sulfate, a molar ratio of sulfuric acid to copper sulfate of about 5:1 to about 8:1, about 5% by weight of polyethylene glycol and about 30 ppm to about 60 ppm of chloride ion.

28. The method of claim 1 wherein the cavity is a through-hole having a diameter of 250 microns or greater.

* * * * *

UNITED STATES PATENT AND TRADEMARK OFFICE
CERTIFICATE OF CORRECTION

PATENT NO. : 6,827,833 B2
DATED : December 7, 2004
INVENTOR(S) : E. Jennings Taylor et al.

It is certified that error appears in the above-identified patent and that said Letters Patent is hereby corrected as shown below:

<u>Column 8,</u>
Line 56, insert -- a -- before "train".

<u>Column 9,</u>
Line 11, insert -- range -- before "of".
Line 30, insert -- % -- after "60".

Signed and Sealed this

First Day of March, 2005

JON W. DUDAS
*Director of the United States Patent and Trademark Office*